United States Patent
Perletti et al.

(10) Patent No.: US 10,057,684 B2
(45) Date of Patent: Aug. 21, 2018

(54) INTEGRATED ELECTROACOUSTIC MEMS TRANSDUCER WITH IMPROVED SENSITIVITY AND MANUFACTURING PROCESS THEREOF

(71) Applicant: STMICROELECTRONICS S.R.L., Agrate Brianza (IT)

(72) Inventors: Matteo Perletti, Boltiere (IT); Stefano Losa, Cornaredo (IT); Lorenzo Tentori, Verano Brianza (IT); Maria Carolina Turi, Milan (IT)

(73) Assignee: STMICROELECTRONICS S.R.L., Agrate Brianza (IT)

(*) Notice: Subject to any disclaimer, the term of this patent is extended or adjusted under 35 U.S.C. 154(b) by 0 days.

(21) Appl. No.: 15/636,423

(22) Filed: Jun. 28, 2017

(65) Prior Publication Data
US 2018/0152788 A1    May 31, 2018

(30) Foreign Application Priority Data

Nov. 30, 2016    (IT) .................... 102016000121533

(51) Int. Cl.
| | |
|---|---|
| *H04R 7/18* | (2006.01) |
| *B81B 3/00* | (2006.01) |
| *B81C 1/00* | (2006.01) |
| *H04R 19/04* | (2006.01) |
| *H04R 19/00* | (2006.01) |

(52) U.S. Cl.
CPC ............. *H04R 7/18* (2013.01); *B81B 3/0054* (2013.01); *B81C 1/00158* (2013.01); *H04R 19/005* (2013.01); *H04R 19/04* (2013.01); *B81B 2201/0257* (2013.01); *B81B 2203/0127* (2013.01); *B81B 2203/0307* (2013.01); *B81B 2203/0315* (2013.01); *B81C 2201/0132* (2013.01)

(58) Field of Classification Search
CPC .... H04R 19/005; H04R 19/04; H04R 31/006; H04R 7/10; H04R 7/18; H04R 7/06; H04R 7/122
See application file for complete search history.

(56) References Cited

U.S. PATENT DOCUMENTS

| | | | |
|---|---|---|---|
| 8,565,452 | B2 | 10/2013 | Coronato et al. |
| 9,363,608 | B2 | 6/2016 | Kasai et al. |
| 2010/0158279 | A1 | 6/2010 | Conti et al. |
| 2010/0329487 | A1* | 12/2010 | David ................ H03F 3/187 381/174 |

(Continued)

FOREIGN PATENT DOCUMENTS

EP    2663093 A1    11/2013

*Primary Examiner* — Mohammad Islam
(74) *Attorney, Agent, or Firm* — Seed IP Law Group LLP

(57) ABSTRACT

An electroacoustic MEMS transducer, having a substrate of semiconductor material; a through cavity in the substrate; a back plate carried by the substrate through a plate anchoring structure, the back plate having a surface facing the through cavity; a fixed electrode, extending over the surface of the back plate; a membrane of conductive material, having a central portion facing the fixed electrode and a peripheral portion fixed to the surface of the back plate through a membrane anchoring structure; and a chamber between the membrane and the back plate, peripherally delimited by the membrane anchoring structure.

25 Claims, 10 Drawing Sheets

(56) References Cited

U.S. PATENT DOCUMENTS

| | | |
|---|---|---|
| 2015/0078592 A1 | 3/2015 | Uchida |
| 2015/0078593 A1 | 3/2015 | Uchida |
| 2016/0021459 A1 | 1/2016 | Inoue et al. |
| 2017/0121173 A1* | 5/2017 | Hoekstra ............... B81B 7/0077 |
| 2017/0217762 A1* | 8/2017 | Hoekstra ............... B81B 7/0061 |

* cited by examiner

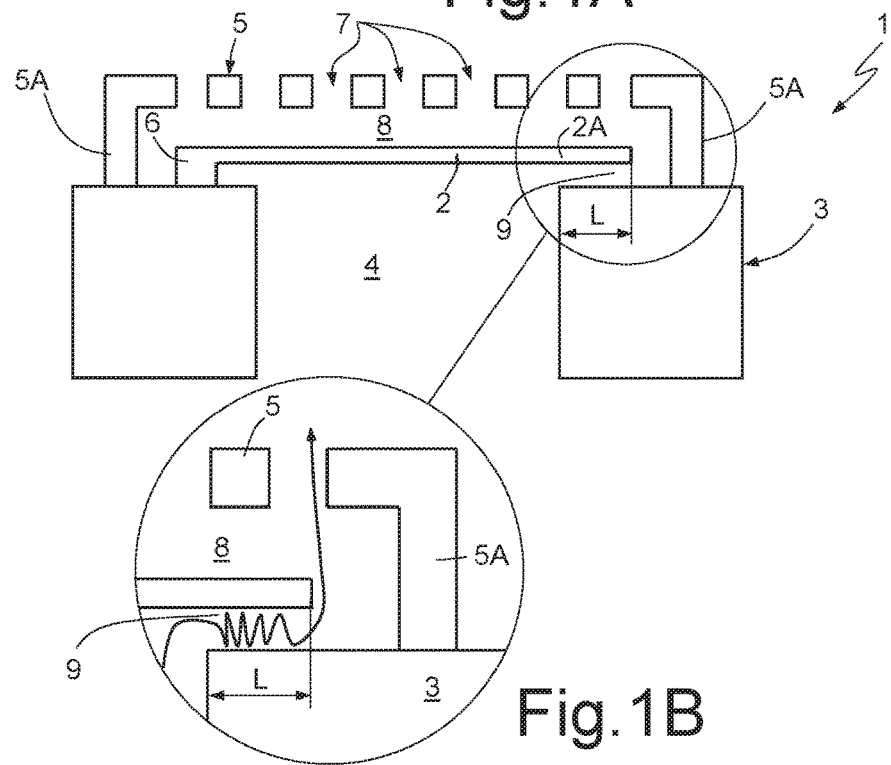
Fig.1A
Fig.1B
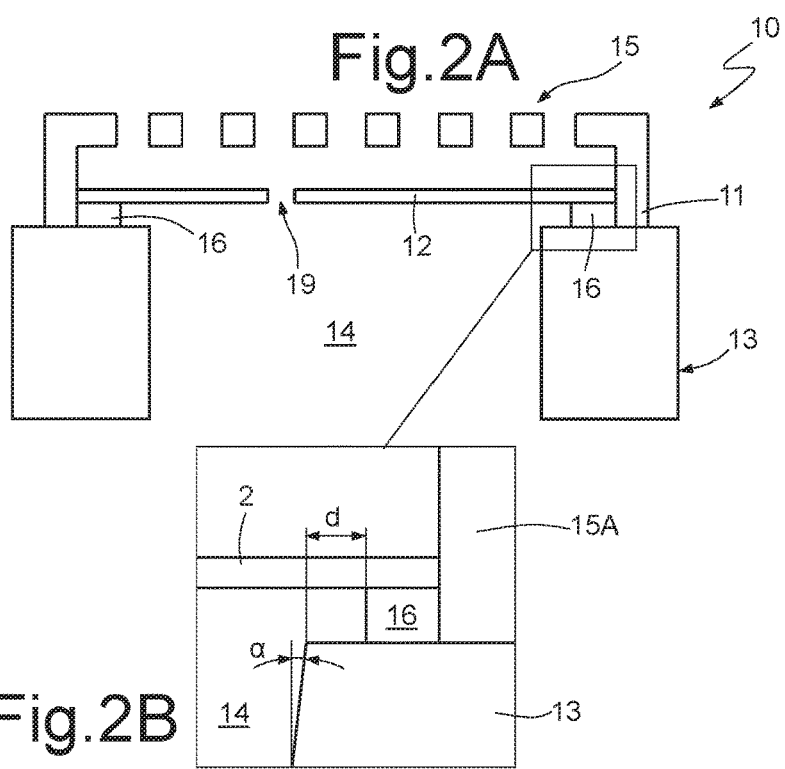
Fig.2A
Fig.2B

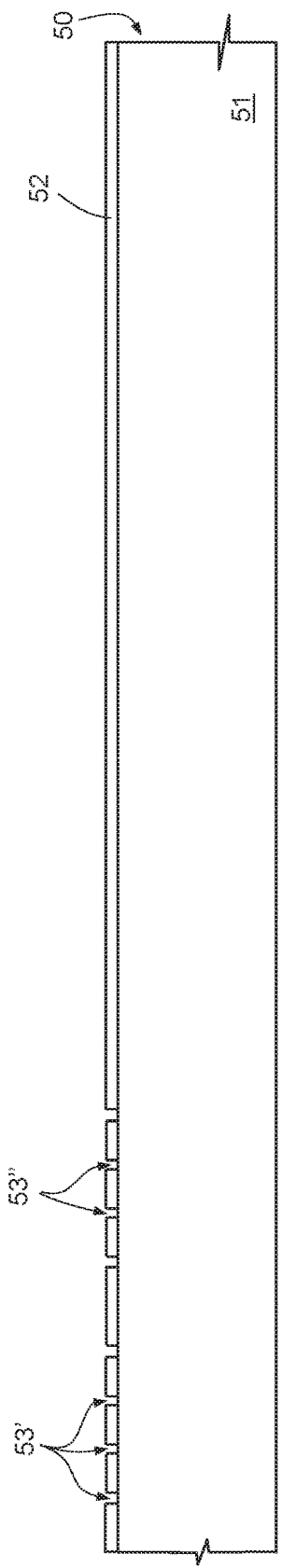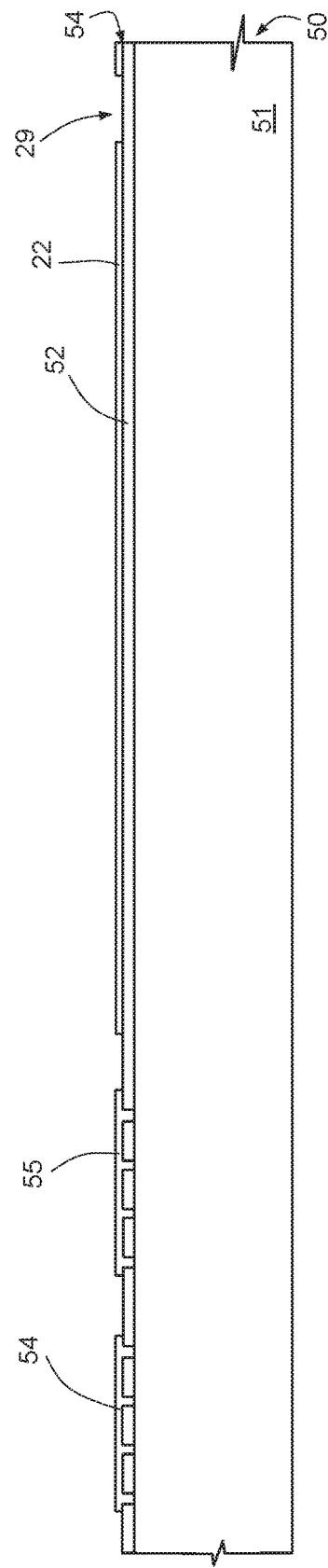

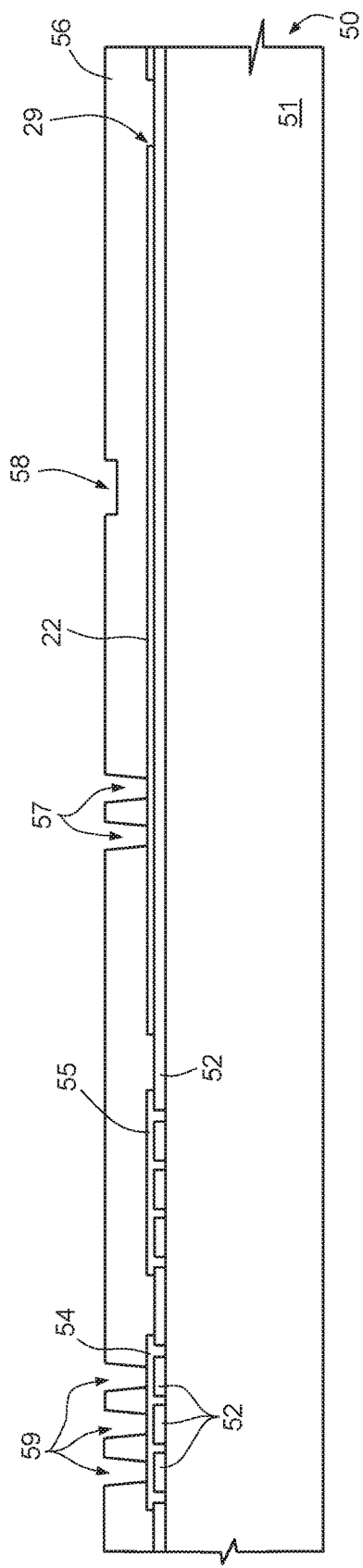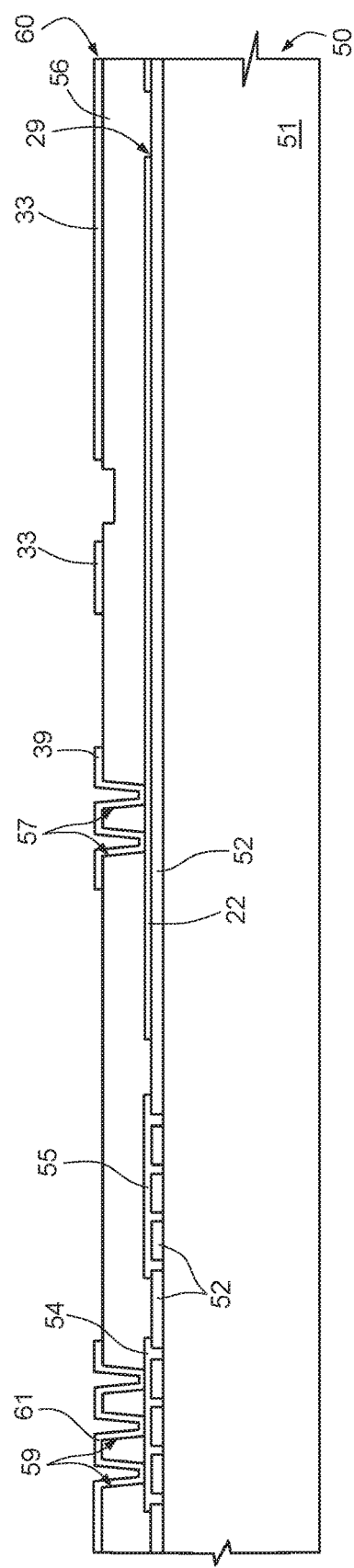

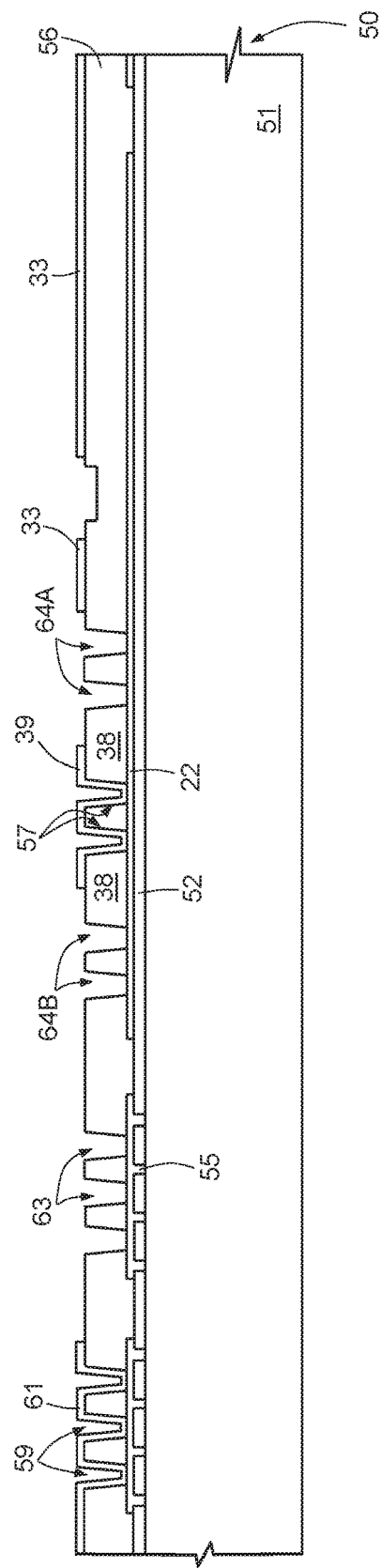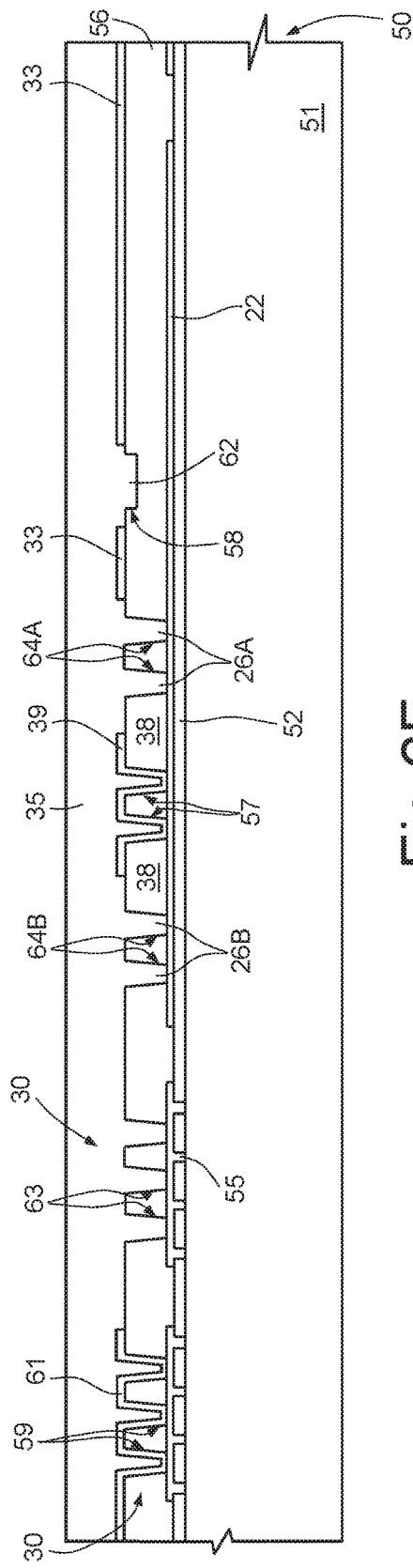

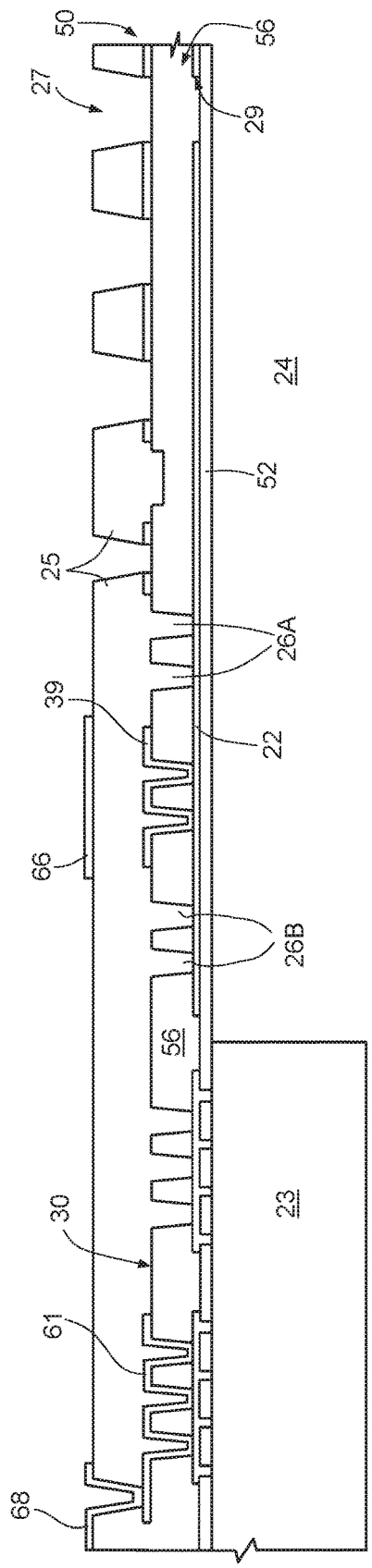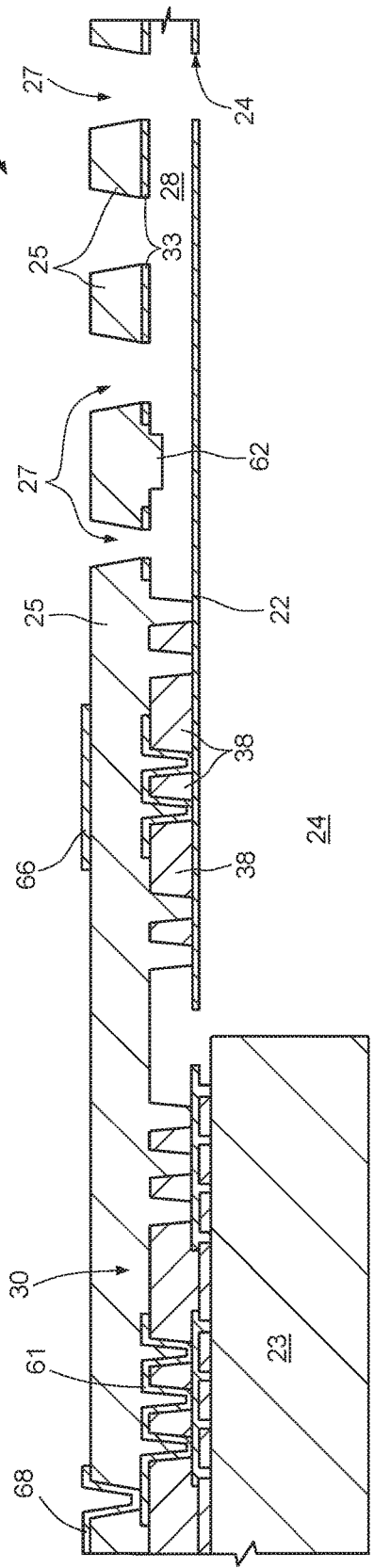

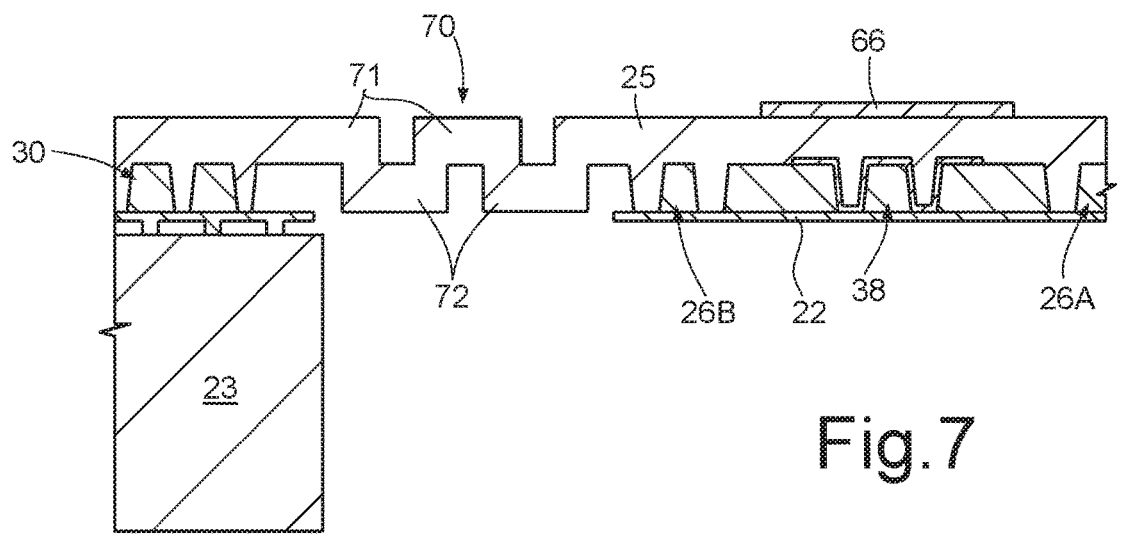

INTEGRATED ELECTROACOUSTIC MEMS TRANSDUCER WITH IMPROVED SENSITIVITY AND MANUFACTURING PROCESS THEREOF

BACKGROUND

Technical Field

The present disclosure relates to an integrated electroacoustic transducer of a MEMS (Micro-Electro-Mechanical System) type with improved sensitivity, and to the manufacturing process thereof.

Description of the Related Art

As is known, MEMS techniques of micromachining semiconductor devices enable production of micrometric structures within layers of semiconductor material, deposited (for example, polycrystalline silicon layers) or grown (for example, epitaxial layers) over sacrificial layers and/or other semiconductor or insulating layers, which are at least partially removed through chemical etching to form mobile or flexible regions.

In particular, MEMS electroacoustic transducers are known, comprising a flexible membrane integrated in or on a semiconductor die. FIGS. 1A and 1B represents schematically, by way of example, a transducer 1 of the back plate and semi-clamped type.

The transducer 1 comprises a membrane 2 carried by a substrate 3 and suspended over a cavity 4 formed in the substrate 3. The membrane 2 faces a reference fixed plate 5, also called "back plate". The back plate 5 is anchored to the substrate 3 through a plate anchor portion 5A and has a plurality of through holes 7, which have the function, during manufacture, of easing removal of the underlying sacrificial layers and, in use, allowing free circulation of air through the back plate 5, towards the membrane 2.

In practice, the membrane 2 directly faces the cavity 4, also called "back chamber", when the acoustic pressure waves impinge first on the back plate 5 and then on the membrane 2. In this case, the space 8 between the back plate 5 and the membrane 2 is also called "air gap".

The membrane 2 and the back plate 5 are, at least in part, of conductive material or carry conductive regions so as to form the plates of a sensing capacitor. In use, acoustic waves impinging upon the membrane 3 cause bending thereof and thus bring about a variation of the distance of the membrane from the back plate and a consequent capacitance variation of the sensing capacitor; this capacitance variation determines a variation of the electrical signal (for example, a voltage) that is outputted and sent to an appropriate processing electronics (not shown).

In the embodiment of FIGS. 1A and 1B, the membrane 2 is arranged in cantilever fashion and is supported by the substrate 3 only on part of its perimeter (in FIG. 1A, on its left-hand side) through a membrane anchoring structure 6, for example integrally formed with the membrane 2. The membrane 2 further has a free end portion 2A (on the right-hand side in FIG. 1A), which extends over the substrate and is able to oscillate. The area between the free end portion 2A and the substrate 3 forms a ventilation hole 9, which gives rise to noise. In fact, as is shown in the enlarged detail, air flowing from the cavity 4 to the front chamber 8 and, through the holes 7 of the back plate 5, to the other side of the transducer 1, is subject to a turbulent motion in the zone of the ventilation hole 9. Thus, this type of transducer has a signal-to-noise ratio (SNR) that is not very high.

The transducer 1 is further affected by the problem that its acoustic characteristics, in particular, its frequency response, depend upon the process spread. In fact, the transducer 1 has a roll-off (namely, the frequency at which the frequency response drops by 3 dB with respect to a reference value at 1 kHz) of a low value, typically lower than 100 Hz, and its value depends upon geometrical quantities, among which the length L of the overlapping between the membrane 2 and the substrate 3, which depend upon the process spread.

In order to solve the above noise problem, transducers of a fully clamped type have already been proposed, wherein the membrane is anchored all along its periphery. An example of transducer of this type is described in U.S. Pat. Pub. No. 2010/0158279 A1, filed in the name of the present applicant, which has the simplified structure shown in FIGS. 2A and 2B. Here, a tranducer 10 has a membrane 12, for example of a circular shape, supported all along its periphery, to this end, on a membrane anchoring structure 16, typically of insulating material such as silicon oxide, of an annular shape, extends the top surface of the substrate, here designated by 13, and fixed to a peripheral portion of the membrane 12. The membrane 12 here has one or more through openings 19, for "equalizing" the static pressure on the faces of the membrane 12. A back plate 15 is also anchored to the substrate 13 through plate anchor regions 11. A space 28 between the back plate 15 and the membrane 22 defines a front chamber; a cavity 24 in the substrate 23 forms the back chamber.

The transducer 10 of FIGS. 2A and 2B, albeit constituting a decided improvement over the partially anchored transducer of FIGS. 1A and 1B as regards noise, may be improved as regards the dependence of the sensitivity and robustness upon the process spread. In fact, these parameters depend upon the size of the membrane 12, and this may vary as a result of process spread during etching of the substrate 13 from the back and while releasing the membrane. In fact, the size of the membrane 12 is given by the "free" area thereof, i.e., by the portion of the membrane layer not constrained to the membrane anchoring structure 16. As clear from the enlarged detail of FIG. 2B, the above size depends upon the point and time of etching of the substrate 13, which determine the verticality of the wall of the cavity (here designated by 14) underneath the membrane 12, as highlighted by the enlarged detail which shows the angle $\alpha$. Further, the size of the membrane 12 also depends upon the distance d of the membrane anchoring structure 16 from the top edge of the substrate 13, which distance is determined by the etching time of the insulating material layer intended to form the membrane anchoring structure 16, in a per se known manner.

BRIEF SUMMARY

One or more embodiments are directed to a MEMS transducer and a manufacturing process thereof. The MEMS transducer may be an acoustic transducer of a capacitive type with fixed back plate and suspended membrane mobile electrode. In at least one embodiment, the MEMS transducer includes a membrane that is coupled to a peripheral portion of a back portion that supports a fixed electrode.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein:

FIGS. 1A and 1B show a schematic representation of a known transducer of a semi-clamped type;

FIGS. 2A and 2B show a schematic representation of a known transducer of a fully clamped type;

FIGS. 6A-6J are cross-sections of an embodiment of the present transducer, in successive manufacturing steps;

FIG. 7 shows a different embodiment of the portion of transducer of FIG. 4;

DETAILED DESCRIPTION

Figure 3:
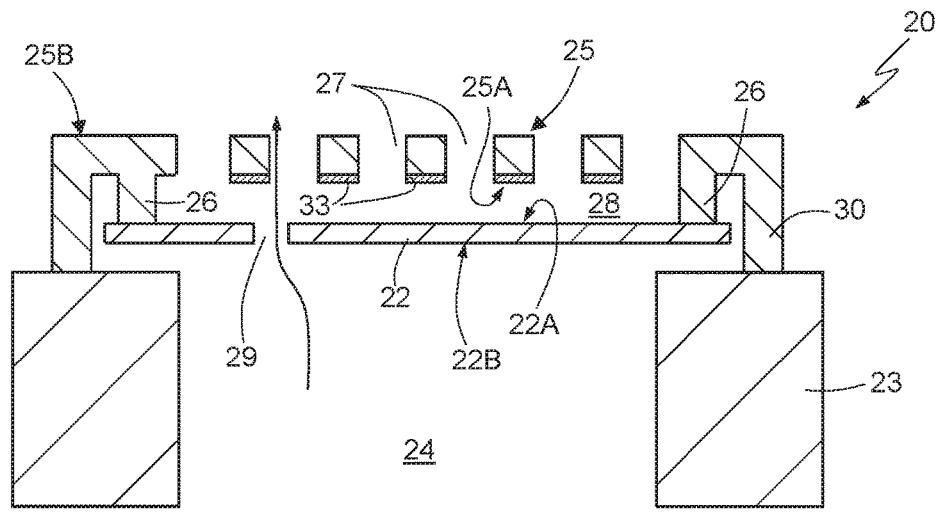
FIG. 3 is a schematic representation of the base structure of the present transducer.

FIG. 3 schematically shows the structure of the present transducer, designated as a whole by 20.

The transducer 20 is of a fully clamped back plate type and comprises a substrate 23 of semiconductor material such as silicon, housing a cavity 24, of a through hole type, and carrying a back plate 25 through a plate anchor region 30. The back plate 25, of insulating material, such as silicon nitride, has a first surface 25A facing the substrate 23, and a second surface 25B, facing in the opposite direction. A fixed electrode 33 of conductive material, for example doped polycrystalline silicon, extends over the first surface 25A. A membrane 22 of conductive material, for example doped polycrystalline silicon, faces the fixed electrode 33 and is carried by the back plate 25 through a membrane anchoring structure 26. The membrane anchoring structure 26, of insulating material, for example of the same material as the back plate 25 and formed simultaneously and monolithically therewith, extends from the first surface 25A of the latter towards the membrane 22. For example, the membrane anchoring structure 26 is formed by one or more continuous regions extending along a closed line, for instance a circumference, as discussed in greater detail hereinafter, and is arranged inside the plate anchor region 30.

The membrane anchoring structure 26 surrounds the fixed electrode 33 and is fixed or bonded to a first face 22A of the membrane 22, facing the fixed electrode 33, on a peripheral portion of the membrane 22. The membrane 22 further has a second face 22B, facing the cavity 24.

A space 28 extends between the back plate 25 and the membrane 22 and forms a front chamber. The cavity 24 forms the back chamber of the transducer 20.

An equalization opening 29 extends through the membrane 22, and a plurality of holes 27 extend through the back plate 25 and the fixed electrode 33. In this way, a flow of air directed from the cavity 24, through the space 28 and the holes 27, towards the second surface 25B of the back plate 25 (or vice versa) follows a substantially linear and non-tortuous path, considerably reducing turbulence and noise.

Further, the membrane 22, fixed to the back plate 25 in a peripheral position, is carried by a fixed and non-vibrating structure, which thus, in turn, does not introduce any substantial noise.

The membrane anchoring structure 26 may be formed so as to precisely control the size of the vibrating part (effective part) of the membrane 22. In fact, the membrane anchoring structure 26 divides a central portion 22A of the membrane 22 (vibrating portion) from a peripheral portion 22B, which does not vibrate. By providing the membrane anchoring structure 26 so that its internal diameter is smaller than the cavity 24 and in any case so that at least the central portion 22A of the membrane 22 completely faces the cavity 24, without overlapping the substrate 23, it is possible to precisely control the electrical characteristics of the transducer 20, which depend upon the size of the effective part (central or vibrating portion 22A) of the membrane 22.

Further, the transducer 20 enables separation and independent definition of the electrical, mechanical, and acoustic structures and thus optimization of each of them independently of the others, as better clarified hereinafter.

Figure 4:
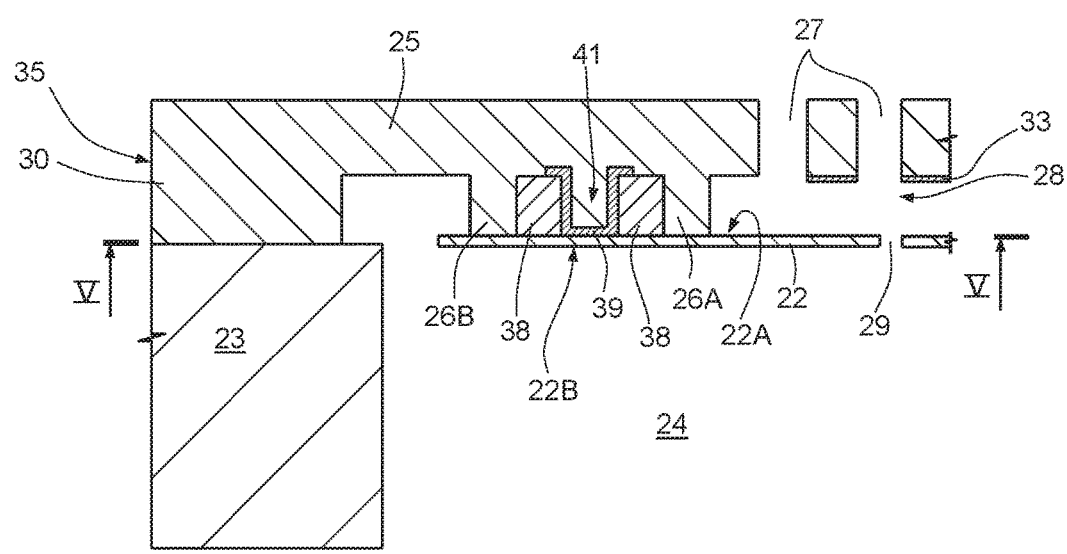
FIG. 4 is a more detailed cross-section of a portion of the transducer of FIG. 3, taken along line IV-IV of FIG. 5.
Figure 5:
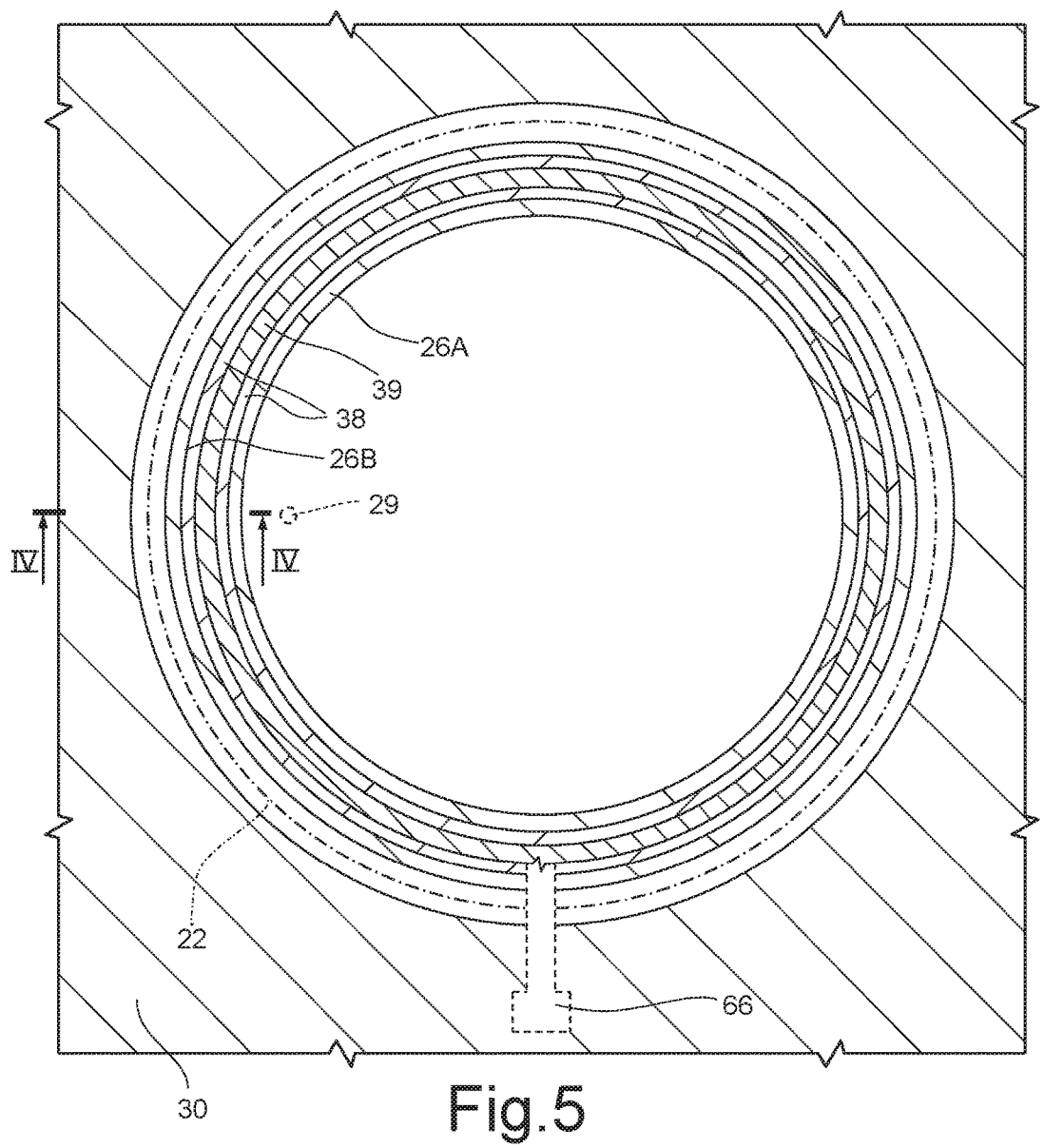
FIG. 5 is a planar section taken along line V-V of FIG. 4.

The membrane anchoring structure 26 may be manufactured as shown in FIGS. 4 and 5, showing a simplified embodiment of a portion of the transducer 20. In these figures, a structural layer 35 of insulating material, typically silicon nitride, extends on the substrate 23 (not visible in FIG. 5), for example, of monocrystalline silicon. The structural layer 35 forms the plate anchor region 30, the back plate 25, and the membrane anchoring structure 26. In particular, the membrane anchoring structure 26 is here formed by two membrane anchor regions 26A, 26B, which extend from the back plate 25 as far as the membrane 22 and have the shape of two concentric rings. Two insulation regions 38 between the two membrane anchor regions 26A, 26B delimit between them an opening 41 accommodating a membrane contact 39. The membrane contact 39 is, for example, formed by a conductive region deposited on the sides of the opening 41, in direct contact with the membrane 22 and obtained from the same layer of the fixed electrode 33.

FIG. 4 further shows the holes 27 in the back plate 25 (not shown in FIG. 5 for clarity); both figures show the equalization opening 29.

As may be noted, the membrane anchor regions 26A, 26B have a purely mechanical function, the membrane contact 39 forms a purely electrical structure, and the fixed electrode 33 and the membrane 22 form a purely acoustic structure, and the three structures, namely the mechanical, the electrical, and the acoustic one, are separate from one another and may be optimized independently. To this end, they may be defined via separate process steps, as explained hereinafter, with reference to an exemplary manufacturing process, shown in FIGS. 6A-6I.

FIG. 6A shows a portion of a wafer 50 of semiconductor material, such as silicon, where a transducer with the simplified structure shown in FIGS. 4 and 5 is to be provided. In a per se known manner, however, various devices may be formed in the wafer 50, arranged side by side.

The wafer 50 is formed by a substrate 51 having a surface 51A whereon a sacrificial anchoring layer 52 has already been deposited and defined, through known photolithographic steps. In particular, the sacrificial anchoring layer 52, for example, of silicon oxide having a thickness of 0.5 to 3 μm, has been removed in some areas so as to form first contact openings 53' and first plate anchor openings 53".

As shown in FIG. 6B, a membrane layer 54, of polycrystalline silicon with a thickness comprised between 200 nm and 2 μm, is deposited or grown on the sacrificial anchoring layer 52. The membrane layer 54, which is deposited doped, fills the first contact openings 53' and the first plate anchor openings 53" with portions of silicon and is then defined so as to form and electrically insulate from each other the membrane 22, a substrate contact region 54, and a plate anchor portion 55. In this step, the equalization opening 29 is also defined.

Next (FIG. 6C), a sacrificial spacer layer 56 is deposited and has the aim of providing a spacing between the membrane 22 and the back plate 25 (which is still to be formed). The sacrificial spacer layer 56, having a thickness, for example, comprised between 0.5 and 5 µm, is then selectively etched and removed where electrical contacts are to be provided. In this way, second contact openings 59 are formed above the plate contact region 54 and third contact openings 57 are formed above the membrane 22. Further, through a separate partial etch (for example, fixed depth etch), recesses 58 are formed in the sacrificial spacer layer 56. The recesses 58, only one whereof is visible in FIG. 6C and which have a smaller depth than the sacrificial spacer layer 56, operate as "mold" for spacer bumps of the back plate 25, as explained hereinafter.

As shown in FIG. 6D, an electrode layer 60 is deposited. The electrode layer 60, of conductive material, such as doped polycrystalline silicon having a thickness of, for example, 0.5 to 2 µm, is then defined so as to form the fixed electrode 33 (on the sacrificial spacer layer 56), the membrane contact 39 (within the third contact openings 57), and a first fixed contact portion 61 (within the second contact openings 59) in electrical contact with the substrate 51, through the substrate contact region 54. It should be noted that the fixed electrode 33 and the contact portions 39, 61 here defined form electrical structures, patterned independently of the mechanical structures.

As shown in FIG. 6E, the sacrificial spacer layer 56 is again etched and selectively removed where the membrane anchor regions 26A, 26B are to be provided, to form second plate anchor openings 63 on the plate anchor portion 55 and membrane anchor openings 64A, 64B on the two sides of the third contact openings 57. As an alternative to what has been shown, the anchor openings 63, 64 may be formed before the second and third contact openings 59, 57 and before forming the fixed electrode 33 and the contact portions 39, 61 (thus, prior to the steps represented in FIGS. 6C-6D).

As shown in FIG. 6F, the structural material layer 35 is deposited for a thickness, for example, comprised between 0.3 and 5 µm. The structural material layer 35, of insulating material such as silicon nitride, fills the second contact openings 59, the second plate anchor openings 63 (where it forms, together with the plate anchor portion 55, the plate anchor region 30), the membrane anchor openings 64A, 64B (where it forms the membrane anchor regions 26A, 26B) and the third contact openings 57. It further fills the recesses 58, where it forms spacers 62 (one whereof is visible).

Figure 6G:
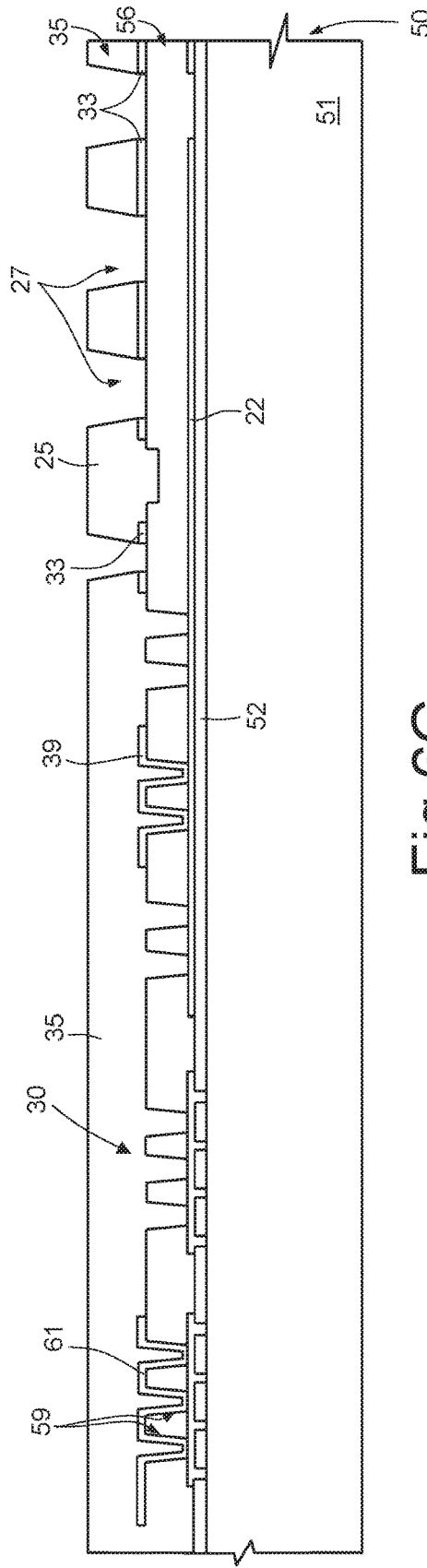

As shown in FIG. 6G, the acoustic structure is patterned, independently of the mechanical and electrical structures. To this end, the structural material layer 35 is again etched and selectively removed so as to form the top part of the holes 27, through the back plate 25. Further, the exposed portions of the material of the fixed electrode 33 are also removed (electrode layer 60) to form the bottom portion of the holes 27.

Figure 6H:
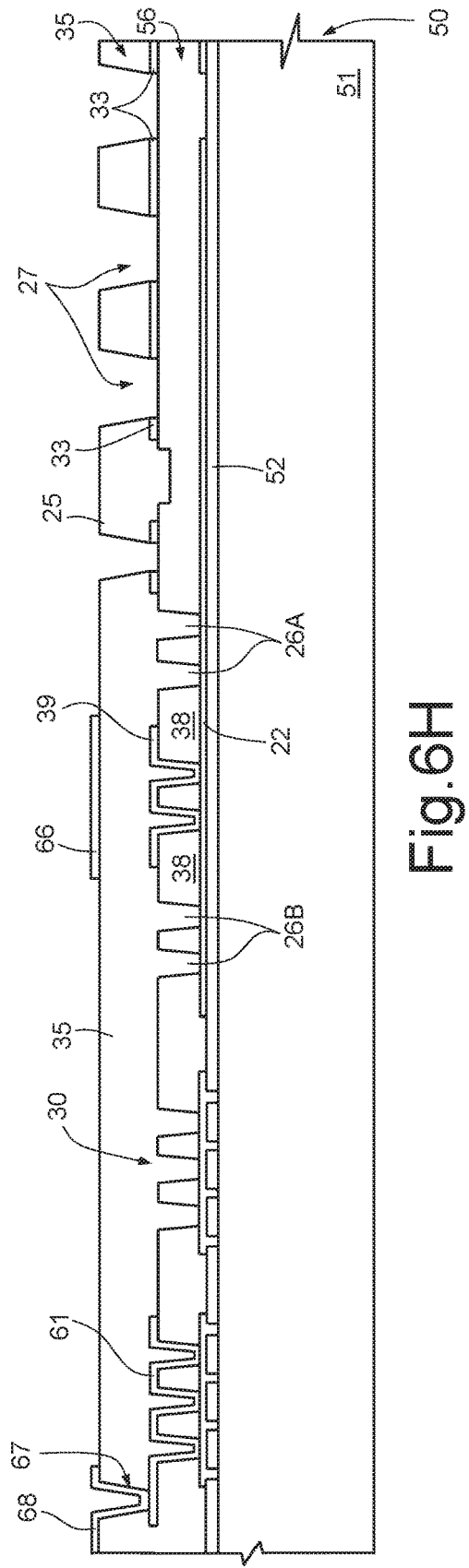

As shown in FIG. 6H, the structural material layer 35 is etched once again and selectively removed so as to form fourth contact openings 67, towards the first fixed contact portion 61 and towards the membrane contact 39 (in a position not visible in the figure). An electrode layer, of conductive material, for example formed by one or more metal layers resistant to subsequent production processes, is then deposited and patterned so as to form a second fixed contact portion 68, in direct electrical contact with the first fixed contact portion 61, and a membrane contact portion, not visible, in direct electrical contact with the membrane contact 39. Next, a metal layer, for example gold, is deposited and patterned to form a stiffening structure 65 and contact pads (not shown, except for the membrane contact pad 66 visible in FIG. 5) in electrical contact with the fixed electrodes 33 and the membrane 22 by vias and conductive paths, in a per se known manner.

As shown in FIG. 6I, in case after thinning the wafer 50, for example via grinding to the desired final thickness, the substrate 51 is etched from the back, via masked dry etching in one or two steps so as to form the cavity 24. The etch stops automatically on the sacrificial anchoring layer 52.

As shown in FIG. 6J, the exposed oxide portions is etched, for releasing the membrane 22, for example by an HF etch. Consequently, the portion of the sacrificial anchoring layer 52 underneath the membrane 22 and the portion of the sacrificial spacer layer 56 between the membrane 22 and the fixed electrode 33 are removed. Further, the portions of the sacrificial anchoring layer 52 between the plate anchor region 30 and the membrane anchoring structure 26 are removed, thus uncoupling the membrane 22 from the plate anchor region 30. Also the space or chamber 28 between the membrane 22 and the back plate 25 is thus formed.

After dicing the wafer 50, one or more transducers 75 are thus obtained, which have the basic structure represented in FIGS. 3 and 4.

The transducer 75 thus obtained may have one or more of the following advantages:

- the membrane 22 may be formed in an optimal way, as regards its thickness and residual stresses, since it is obtained in a purposely provided layer, and any possible other regions formed in the same layer (regions 54, 55) are not critical;
- the back plate may be formed in an optimal way from mechanical and electrical points of view;
- the spacing (chamber 28) between the fixed electrode 33 and the membrane 22 may be chosen suitably;
- the electrical, mechanical, and acoustic structures are formed in separate and independent process steps, which enable separate optimization of each structure, on the basis of the desired function; in fact, apart from the membrane 22, which has both an electrical and an acoustic function, the purely electrical structures (fixed electrode 33, contacts 39, 61, 68) are obtained during the steps of FIGS. 6C-6D, the mechanical structures (back plate 25, anchors 30, 26) are obtained during the steps of FIGS. 6C-6D, and the purely acoustic structures (equalization opening 29, holes 27) are obtained during the steps of FIGS. 6B and 6G; and
- the size of the effective part (central portion 22A) of the membrane 22 may be controlled with high accuracy, since it depends only upon the position of the membrane anchor regions 26, also because the entire membrane 22 (and thus, in particular, the central portion 22A) completely overlies the cavity 24, without overlapping the substrate 23 or being shielded thereby, whereas the acoustic frequency response performance depends only upon the size of the equalization opening 29 in the membrane 22, irrespective of other process parameters.

FIG. 7 shows a variant of the transducer 75 of FIG. 6I. Here, an elastic decoupling structure 70 extends between the back plate 25 and the plate anchor region 30. The elastic decoupling structure 70 is formed in the same structural layer 35, by alternating first portions 71, which extend at the same level as the back plate 25, and second portions 72, which extend at the level of the sacrificial spacer layer 56, to form a sort of zigzag or fret.

The elastic decoupling structure 70 is useful for decoupling the sensitive area (membrane 22+back plate 25) from the plate anchor portion 30 and thus from the substrate 23 so as to prevent any possible packaging stresses from being transmitted to the sensitive area.

The elastic decoupling structure 70 may be manufactured by introducing a particular step of masking and etching of the sacrificial spacer layer 56 between the steps shown in FIGS. 6D and 6E so as to remove the portions of the sacrificial spacer layer 56 where second portions 72 are to be formed and by sizing the second portions 72 and their distance so that the subsequent deposition of the structural layer 35 in this area, approximately conformally follows the underlying conformation.

Figure 8:
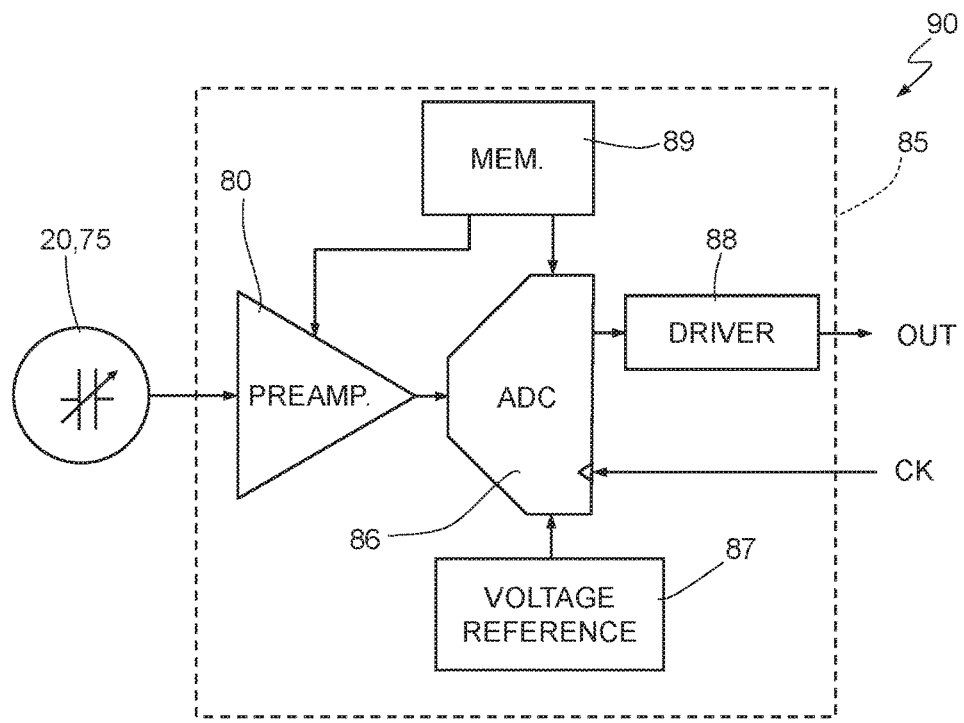
FIG. 8 is a block diagram of an acoustic transducer comprising the present transducer.

The transducer 75 of FIGS. 3, 4, and 6I may be connected to an interface circuit. The interface circuit may be formed by a simple read preamplifier consisting, for example, of a charge amplifier having an inverting input connected to the transducer 75. In this case, the read preamplifier outputs an analog signal that may be directly used. Alternatively, the interface circuit may supply a digital output. For example, in FIG. 8, the interface circuit, designated by 85 and implemented as an ASIC (Application Specific Integrated Circuit), comprises a read preamplifier 80; an analog-to-digital converter 86, for example of a Sigma-Delta type, configured to receive a clock signal CK and the signal amplified by the read preamplifier 80; a reference signal generator circuit 87; and a driver 88, designed to function as an interface between the analog-to-digital converter 86 and an external system, for example a microcontroller of an associated electronic device.

Further, the interface circuit 85 may comprise a (volatile or nonvolatile) memory 89, for example programmable from outside. The acoustic transducer 20, 75 and the interface circuit 85 together form a microphone 90.

Advantageously, two distinct dice integrate the transducer 20, 75 and the interface circuit 85; they may be accommodated in a single package, in an appropriate arrangement (for example stacked, or arranged side by side).

Figure 9:
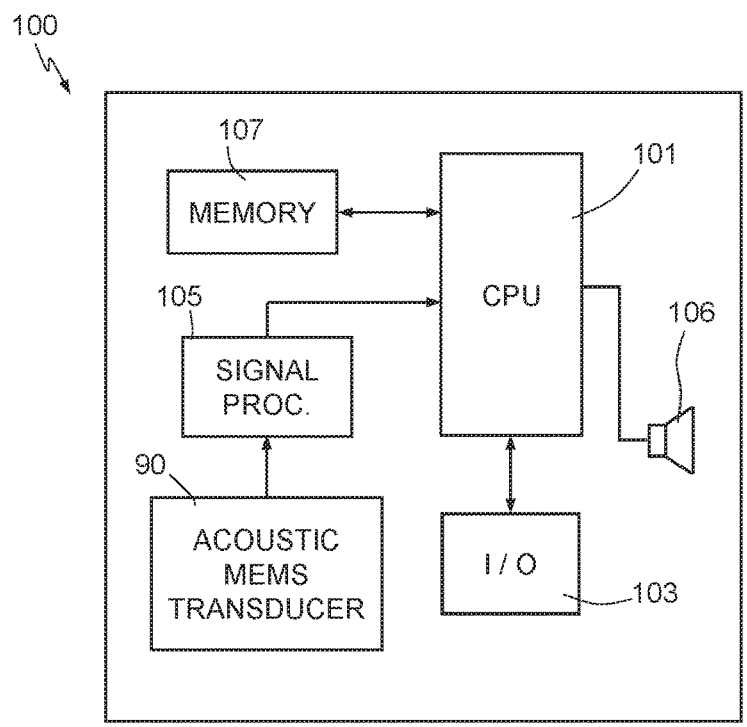
FIG. 9 is a simplified block diagram of an electronic apparatus having the present transducer.

The microphone 90 may be used in an electronic device 100, as shown in FIG. 9.

The electronic device 100 is, for example, a portable mobile communication device, such as a cellphone, a personal digital assistant (PDA), a notebook, but also a voice recorder, a player of audio files with voice recording capacity, etc. Alternatively, the electronic device 100 may be a listening apparatus, such as an earphone system, a hydrophone, able to work underwater, or a wearable device, such as a hearing aid device.

The electronic device 100 of FIG. 9 comprises a microprocessor 101 and an input/output unit 103, for example including a keypad and a display, connected to the microprocessor 101. The microphone 90 communicates with the microprocessor 101 through a signal processing block 105 (which may carry out further processing of the analog or digital signal at the output of the microphone 90). Further, the electronic device 100 may comprise a speaker 106, for generating sounds on an audio output (not shown), and an internal memory 107.

Finally, it is clear that modifications and variations may be made to the electroacoustic transducer and to the manufacturing process as described and illustrated herein, without thereby departing from the scope of the present disclosure.

For example, the membrane 22 may have any shape, for example square or rectangular. It may further include notches designed so as to control the dependence of the resonance frequency upon the material stress, as described in detail in U.S. Pat. Pub. No. 2010/0158279.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electroacoustic MEMS transducer, comprising:
a substrate of semiconductor material;
a through cavity in the substrate;
a plate anchoring structure;
a back plate coupled to the substrate by the plate anchoring structure, the back plate having a surface facing the through cavity;
a fixed electrode coupled to the surface of the back plate;
a membrane anchoring structure;
a membrane of conductive material, the membrane having a central portion facing the fixed electrode and a peripheral portion fixed to the surface of the back plate by the membrane anchoring structure such that the membrane anchoring structure is in contact with the membrane and is between the back plate and the membrane; and
a chamber between the membrane and the back plate, the chamber being peripherally delimited by the membrane anchoring structure.

2. The electroacoustic MEMS transducer according to claim 1, wherein the semiconductor material is silicon, wherein the plate anchoring structure and the membrane anchoring structure are silicon nitride, and wherein the membrane and the fixed electrode are silicon.

3. The electroacoustic MEMS transducer according to claim 1, wherein the membrane and the fixed electrode are of semiconductor material.

4. The electroacoustic MEMS transducer according to claim 1, wherein the membrane anchoring structure is arranged externally with respect to the fixed electrode.

5. The electroacoustic MEMS transducer according to claim 1, wherein the back plate and the fixed electrode are perforated, and wherein the membrane has an equalization opening in the central portion.

6. An electroacoustic MEMS transducer, comprising:
a substrate of semiconductor material;
a through cavity in the substrate;
a plate anchoring structure;
a back plate coupled to the substrate by the plate anchoring structure, the back plate having a surface facing the through cavity;
a fixed electrode coupled to the surface of the back plate;
a membrane of conductive material, the membrane having a central portion facing the fixed electrode and a peripheral portion; and
a membrane anchoring structure, the membrane being fixed to the surface of the back plate by the membrane anchoring structure, the membrane anchoring structure comprising at least two bumps extending at a distance from each other along the peripheral portion of the membrane and accommodating an insulating structure in between the at least two bumps, the insulating structure accommodating a membrane contact of conductive material, the membrane contact being in direct contact with the membrane.

7. The electroacoustic MEMS transducer according to claim 6, wherein the back plate, the plate anchoring structure, and the membrane anchoring structure are a monolithic structural layer of insulating material, wherein the plate anchoring structure surrounds the membrane anchoring structure.

8. The electroacoustic MEMS transducer according to claim 7, comprising a decoupling structure arranged between the back plate and the plate anchoring structure.

9. The electroacoustic MEMS transducer according to claim 8, wherein the decoupling structure comprises an elastic region.

10. The electroacoustic MEMS transducer according to claim 9, wherein the elastic region comprises a plurality of structural layer portions extending at different levels and with a substantially zigzag pattern.

11. The electroacoustic MEMS transducer according to claim 1, wherein at least the central portion of the membrane is arranged to completely face the cavity.

12. The electroacoustic MEMS transducer according to claim 1, wherein the electroacoustic MEMS transducer is a microphone.

13. An electronic device, comprising:
a microprocessor control unit; and
an acoustic MEMS transducer, the acoustic MEMS transducer including:
  a substrate of semiconductor material, the substrate including a through cavity;
  a back plate coupled to the substrate, the back plate including a fixed electrode facing the through cavity;
  a membrane having a central portion and a peripheral portion, the peripheral portion coupled to the back plate, the central portion facing the through cavity;
  a membrane anchoring structure extending from the back plate, an end of the membrane anchoring structure in contact with the peripheral portion of the membrane; and
  a chamber between the membrane and the back plate, the chamber being peripherally delimited by the membrane anchoring structure.

14. The electronic device according to claim 13, wherein the peripheral portion of the membrane is coupled to the back plate at a location that faces the through cavity.

15. The electronic device according to claim 13, wherein the peripheral portion of the membrane is coupled to the back plate at a location that is outward of the through cavity.

16. The electronic device according to claim 13, wherein the back plate has a surface facing the substrate, the acoustic MEMS transducer further including a membrane anchoring structure, wherein the peripheral portion of the membrane is coupled to the surface of the substrate by the membrane anchoring structure.

17. A process comprising:
forming a first sacrificial layer on a body of semiconductor material;
forming a membrane on the first sacrificial layer;
forming a second sacrificial layer on the membrane;
forming at least one plate anchor opening and at least one membrane anchor opening in the second sacrificial layer by removing at least one first selective portion and at least one second selective portion of the second sacrificial layer, the at least one plate anchor opening surrounding the at least one membrane anchor opening;
forming a fixed electrode on the second sacrificial layer over the membrane;
forming a structural layer of insulating material, the structural layer entering the at least one plate anchor opening and the at least one membrane anchor opening and forming at least one plate anchoring structure and at least one membrane anchoring structure;
patterning the structural layer to form a back plate;
forming a through cavity in the body, the through cavity facing the membrane; and
removing exposed portions of the first and second sacrificial layers and releasing the membrane and forming a chamber between the membrane and the fixed electrode.

18. The process according to claim 17, comprising:
before forming a fixed electrode, forming at least one membrane electrical contact opening in the second sacrificial layer by removing at least one third selective portion of the second sacrificial layer; and
forming at least one membrane electrical contact region in the membrane electrical contact openings and in direct electrical contact with the membrane.

19. The process according to claim 18, wherein forming the at least one membrane electrical contact opening is carried out separately from forming the at least one plate anchor opening and the at least one membrane anchor opening.

20. The process according to claim 18, comprising, simultaneously with forming the at least one membrane electrical contact opening, forming at least one plate electrical contact opening in the second sacrificial layer by removing at least one fourth selective portion of the second sacrificial layer and, simultaneously with forming the at least one membrane electrical contact region, forming at least one plate electrical contact region in the plate electrical contact opening.

21. The process according to claim 17, further comprising forming an elastic decoupling structure arranged between the back plate and the plate anchoring structure.

22. An electroacoustic MEMS transducer, comprising:
a substrate of semiconductor material;
a through cavity in the substrate;
a plate anchoring structure;
a back plate coupled to the substrate by the plate anchoring structure, the back plate having a surface facing the through cavity;
a decoupling structure arranged between the back plate and the plate anchoring structure;
a fixed electrode coupled to the surface of the back plate;
a membrane anchoring structure;
a membrane of conductive material, the membrane having a central portion facing the fixed electrode and a peripheral portion fixed to the surface of the back plate by the membrane anchoring structure; and
a chamber between the membrane and the back plate, the chamber being peripherally delimited by the membrane anchoring structure.

23. The electroacoustic MEMS transducer according to claim 22, wherein the decoupling structure comprises an elastic region.

24. The electroacoustic MEMS transducer according to claim 22, wherein the back plate, the plate anchoring structure, and the membrane anchoring structure are a monolithic structural layer of insulating material, wherein the plate anchoring structure surrounds the membrane anchoring structure.

25. The electroacoustic MEMS transducer according to claim 22, wherein the membrane anchoring structure extends between the membrane and the surface of the back plate.

* * * * *